(12) United States Patent
Nagase et al.

(10) Patent No.: US 7,817,399 B2
(45) Date of Patent: Oct. 19, 2010

(54) PWM DRIVE APPARATUS AND METHOD FOR CORRECTING OUTPUT OFFSET THEREOF

(75) Inventors: Hisanori Nagase, Osaka (JP); Tomohiro Kume, Osaka (JP)

(73) Assignee: Panasonic Corporation, Osaka (JP)

( * ) Notice: Subject to any disclaimer, the term of this patent is extended or adjusted under 35 U.S.C. 154(b) by 526 days.

(21) Appl. No.: 11/940,028

(22) Filed: Nov. 14, 2007

(65) Prior Publication Data

US 2008/0130186 A1    Jun. 5, 2008

(30) Foreign Application Priority Data

Nov. 30, 2006  (JP) .............................. 2006-324253

(51) Int. Cl.
*H01H 47/28*  (2006.01)
*H01H 47/32*  (2006.01)

(52) U.S. Cl. ..................................................... 361/153
(58) Field of Classification Search .................. 361/153
See application file for complete search history.

(56) References Cited

U.S. PATENT DOCUMENTS

| | | | | |
|---|---|---|---|---|
| 4,300,081 A | * | 11/1981 | Van Landingham | ......... 318/599 |
| 4,611,158 A | * | 9/1986 | Nagase et al. | ................ 318/803 |
| 4,965,504 A | * | 10/1990 | Ueda et al. | .................... 318/802 |
| 5,384,518 A | * | 1/1995 | Kido et al. | .................... 315/225 |
| 5,990,751 A | * | 11/1999 | Takita | .......................... 330/297 |
| 6,441,685 B1 | * | 8/2002 | MacMillan | ................... 330/10 |
| 6,642,696 B2 | * | 11/2003 | Tateishi | ....................... 323/222 |
| 7,489,190 B2 | * | 2/2009 | Wu et al. | ........................ 330/10 |
| 2008/0130186 A1 | * | 6/2008 | Nagase et al. | ................ 361/154 |

FOREIGN PATENT DOCUMENTS

JP            3803437          5/2006

* cited by examiner

*Primary Examiner*—Ronald W Leja
(74) *Attorney, Agent, or Firm*—McDermott Will & Emery LLP

(57) ABSTRACT

A first voltage-to-current converter converts a difference voltage between a command voltage and a reference voltage into a current. A second voltage-to-current converter converts a difference voltage between a positive output terminal and a negative output terminal of a PWM drive apparatus into a current. A low-pass filter is connected to a connection point between an output terminal of the first voltage-to-current converter and an output terminal of the second voltage-to-current converter. An amplifier amplifies a difference voltage between a voltage at the connection point and a reference voltage. A PWM modulator PWM-modulates an output voltage of the amplifier. A drive section drives a load in accordance with an output signal of the PWM modulator.

15 Claims, 12 Drawing Sheets

PWM DRIVE APPARATUS AND METHOD FOR CORRECTING OUTPUT OFFSET THEREOF

CROSS REFERENCE TO RELATED APPLICATIONS

This Non-provisional application claims priority under 35 U.S.C. §119(a) on Patent Application No. 2006-324253 filed in Japan on Nov. 30, 2006, the entire contents of which are hereby incorporated by reference.

BACKGROUND OF THE INVENTION

1. Field of the Invention

The present invention relates to a drive apparatus for an electromagnetic actuator. More particularly, the present invention relates to a PWM drive apparatus which has a small size and light weight achieved by semiconductor circuit technology and is capable of driving an actuator with a high level of power efficiency.

2. Description of the Related Art

In recent years, a PWM drive method is commonly used as a means for reducing power consumption required to drive electromagnetic actuators for focus, tracking and tilt controls, a spindle motor, a pickup moving motor or the like in optical disc players. The size and weight of a PWM drive apparatus are reduced by packing major parts thereof into a single semiconductor chip.

FIG. 11 shows a structure of a conventional PWM drive apparatus. A lag-lead filter comprising resistances 211 and 212 and a capacitance 213 which are connected in series is connected to an input terminal 101 of a voltage Vin. The voltage Vin is a command voltage which commands an average drive voltage to be applied to a load 200. An absolute value circuit 214 receives a voltage at a connection point of the resistances 211 and 212, and outputs the absolute value Vabs and the sign Vsign of the voltage. A PWM modulator 215 PWM-modulates the absolute value Vabs using a triangular wave which is generated by a triangular wave oscillator 216. A drive section 217 drives the load 200 by supplying a voltage to a positive output terminal 102 and a negative output terminal 103 based on a PWM-modulated signal and the sign Vsign which is input through a direction switch circuit 218. A voltage VFO of the positive output terminal 102 and a voltage VRO of the negative output terminal 103 are input to a differential-input voltage-to-current converter 219, and a current proportional to the difference voltage is supplied to the capacitance 213. Thus, the lag-lead filter comprising the resistances 211 and 212 and the capacitance 213, and the voltage-to-current converter 219 form a negative feedback circuit in the PWM drive apparatus.

FIG. 12 equivalently shows the PWM drive apparatus of FIG. 11 using two blocks, i.e., a gain block having a gain G which includes the absolute value circuit 214, the drive section 217 and the load 200, and a modulation index block having a modulation index M ($0 \leq M \leq 1$) which includes the triangular wave oscillator 216 and the PWM modulator 215. A closed loop gain $G_{close}$ of the PWM drive apparatus is represented by:

$$G_{close}\big|_{Rb=\frac{1}{GM\cdot gm}} = \frac{1}{gm\cdot Ra + \frac{1}{GM}} \approx \frac{1}{gm\cdot Ra}(GM \gg 1)$$

where Ra represents the resistance value of the resistance 211, Rb represents the resistance value of the resistance 212, and gm represents the transconductance of the voltage-to-current converter 219.

Specifically, the closed loop gain of the PWM drive apparatus is approximately determined based on the resistance value of the resistance 211 and the transconductance of the voltage-to-current converter 219. In general, however, a transconductance is determined as an operation of a semiconductor circuit, while a resistance value is determined based on the dimension and material of a resistance, so that a gain change occurs due to a device-to-device variation, a temperature change, or the like.

Further, when the command voltage Vin which is zero is input, an offset voltage is applied to the load 200 due to an offset current of the voltage-to-current converter 219, so that an incorrect torque occurs in an electromagnetic actuator or the like. Also, saturation occurs at either a positive or negative peak, depending on the magnitude of the command voltage Vin, so that a distortion occurs in an output current and a voltage waveform.

To avoid the above-described drawback, a semiconductor element included in the voltage-to-current converter 219, particularly an element involved in a differential operation or the like, is caused to be as large as possible so as to reduce variations in electrical resistance due to an error in dimension of the semiconductor element during formation, thereby making it possible to reduce variations in voltage and current in the circuit. However, this solution runs counter to the reduction of power consumption by recent microfabrication or cost reduction by decreasing the area of a chip, i.e., cost increases due to increases in power consumption and chip area.

It is also possible to adjust a voltage and a current into predetermined values by changing a circuit constant by laser trimming or the like. However, this solution requires a trimming process after measurement of an offset current or the like for each individual device, so that considerable effort and time are required, unavoidably leading to an increase in cost.

SUMMARY OF THE INVENTION

In view of the above-described problems, an object of the present invention is to provide a PWM drive apparatus in which a gain change due to a device-to-device variation, a temperature change or the like is reduced without an increase in chip area or a post-process, such as laser trimming or the like. Another object of the present invention is to correct an output offset of the PWM drive apparatus.

To achieve the above-described objects, the present invention provides a PWM drive apparatus for driving a load by a PWM control, depending on a command voltage, comprising a first voltage-to-current converter for converting a difference voltage between the command voltage and a reference voltage into a current, a second voltage-to-current converter for converting a difference voltage between a positive output terminal and a negative output terminal of the PWM drive apparatus into a current, a low-pass filter connected to a connection point between an output terminal of the first voltage-to-current converter and an output terminal of the second voltage-to-current converter, an amplifier for amplifying a difference voltage between a voltage at the connection point and a reference voltage, a PWM modulator for PWM-modulating an output voltage of the amplifier, and a drive section for driving the load in accordance with an output signal of the PWM modulator. Thereby, the closed loop gain of the PWM drive apparatus is substantially determined based on the transconductance ratio of the first and second voltage-to-current converters. When the transconductances of the first and second voltage-to-current converters change in similar manners due to a change in ambient temperature or the like, the changes cancel each other, so that the closed loop gain is maintained constant. Therefore, an operation can be performed with a more stable gain.

Preferably, the PWM drive apparatus further comprises a first switch circuit for switching between short-circuiting and opening of positive and negative input terminals of the first voltage-to-current converter, a second switch circuit for switching between short-circuiting and opening of positive and negative input terminals of the second voltage-to-current converter, an offset correcting circuit having a variable current source connected to the connection point, and a control circuit for controlling the first and second switch circuits and the offset correcting circuit. In a correction mode, the control circuit causes the first and second switch circuits to short-circuit the positive and negative input terminals of the first and second voltage-to-current converters, and the offset correcting circuit gradually changes a control amount with respect to the variable current source, from an initial value thereof, in accordance with an instruction from the control circuit, to determine a correction current to be supplied to the connection point. In a normal mode, the control circuit causes the first and second switch circuits to open between the positive and negative input terminals of the first and second voltage-to-current converters, and the offset correcting circuit supplies the determined correction current to the connection point.

The present invention also provides a method for correcting an output offset of the PWM drive apparatus comprises a first step of short-circuiting positive and negative input terminals of each of the first and second voltage-to-current converters to determine a correction current to be supplied to the connection point, and a second step of canceling the short-circuit of the positive and negative input terminals of each of the first and second voltage-to-current converters and supplying the determined correction current to the connection point. Thereby, the positive and negative input terminals of each of the first and second voltage-to-current converters are short-circuited so that only an offset current is output, thereby determining a correction current to be supplied to the connection point. Thereafter, the short-circuit of the positive and negative input terminals of each of the first and second voltage-to-current converters is canceled, and the determined correction current is supplied to the connection point. Therefore, the output offset of the PWM drive apparatus during a normal operation can be reduced or canceled.

More preferably, in the correction mode, the offset correcting circuit, when detecting that an output of the amplifier goes from a first logic level to a second logic level, stores a control amount with respect to the variable current source at that time. In the normal mode, the offset correcting circuit controls the variable current source with the stored control amount. Also, more preferably, in the first step, the current supplied to the connection point is gradually changed from an initial value thereof, and when it is detected that an output of the amplifier goes from a first logic level to a second logic level, a current at that time is stored as the correction current. In the second step, the stored correction current is supplied to the connection point. Thereby, a correction current which can just cancel the offset currents of the first and second voltage-to-current converter can be easily determined.

Even more preferably, the offset correcting circuit, when detecting that the output of the amplifier is at the second logic level at start of the correction mode, maintains the control amount with respect to variable current source at the initial value. Alternatively, in the correction mode, the offset correcting circuit, when detecting that the control amount with respect to the variable current source reaches an end-of-change value, maintains the control amount with respect to the variable current source at the end-of-change value. Thereby, when a correction current which can just cancel the offset currents of the first and second voltage-to-current converters is not found within an adjustable range, the supply current of the variable current source can be fixed to the upper or lower limit value of the adjustable range.

Specifically, the control circuit outputs a digital signal indicating the control amount with respect to the variable current source, and a control signal indicating timing of holding the digital signal. The offset correcting circuit has a latch circuit for latching the digital signal in accordance with the control signal, and a current control section for controlling a supply current of the variable current source in accordance with an output signal of the latch circuit. Thereby, a circuit for storing a control amount with respect to the variable current source can be easily comprised of a digital circuit.

More preferably, the control circuit deviates edges of the digital signal and the control signal from each other and outputs the resultant digital signal and control signal. Alternatively, the offset correcting circuit has a delay circuit for delaying the control signal. Alternatively, the offset correcting circuit has a capacitor connected to the connection point. Thereby, the output logic level of the amplifier is prevented from being incorrectly inverted due to glitch noise which occurs when the latch circuit latches the digital signal, so that the latch circuit is incorrectly stopped.

Also, preferably, the low-pass filter has a capacitor, and a switch for switching between short-circuiting and opening of the capacitor and the connection point. In the correction mode, the control circuit causes the switch to open between the capacitor and the connection point. In the normal mode, the control circuit causes the switch to short-circuit the capacitor and the connection point. Thereby, in the correction mode, the capacitor can be electrically cut off from the connection point of the output terminals of the first and second voltage-to-current converters, so that a more accurate correction current can be determined.

Also, preferably, in the correction mode, the control circuit suspends power supply to the load. Thereby, it is possible to prevent a load from being accidentally operated in the correction mode.

Also, the offset correcting circuit may have a comparator for comparing a voltage of the connection point and a reference voltage. In this case, in the correction mode, the offset correcting circuit, when detecting that an output of the comparator goes from a first logic level to a second logic level, stores a control amount with respect to the variable current source at that time. In the normal mode, the offset correcting circuit controls the variable current source with the stored control amount.

The present invention also provides a drive system comprising a plurality of the PWM drive apparatuses. Each of the plurality of PWM drive apparatuses has a first switch circuit for switching between short-circuiting and opening of positive and negative input terminals of the first voltage-to-current converter, and a second switch circuit for switching between short-circuiting and opening of positive and negative input terminals of the second voltage-to-current converter. The drive system comprises a plurality of offset correcting circuits having variable current sources connected to the connection points of the plurality of PWM drive apparatuses, a triangular wave oscillator for supplying a triangular wave for PWM modulation to the PWM modulators of the plurality of the PWM drive apparatuses in common, and a control circuit for controlling the first and second switch circuits and the offset correcting circuits of the plurality of PWM drive apparatuses in common. In each of the plurality of PWM drive apparatuses, in a correction mode, the control circuit causes the first and second switch circuits to short-circuit the positive and negative input terminals of the first and second voltage-to-current converters, and the plurality of offset correcting circuits gradually change control amounts with respect to the variable current sources, from initial values thereof, in accordance with an instruction from the control circuit, to determine correction currents to be supplied to the connection points, and in a normal mode, the control circuit causes the first and second switch circuits to open between the positive and negative input terminals of the first and second voltage-to-current converters, and the plurality of offset correcting circuits supply the determined correction currents to the connection points. Thereby, the size and cost of the whole drive system can be reduced while stabilizing the gain of each PWM drive apparatus and reducing the output offset thereof.

DETAILED DESCRIPTION OF THE PREFERRED EMBODIMENTS

Hereinafter, embodiments of the present invention will be described with reference to the accompanying drawings.

First Embodiment

Figure 1:
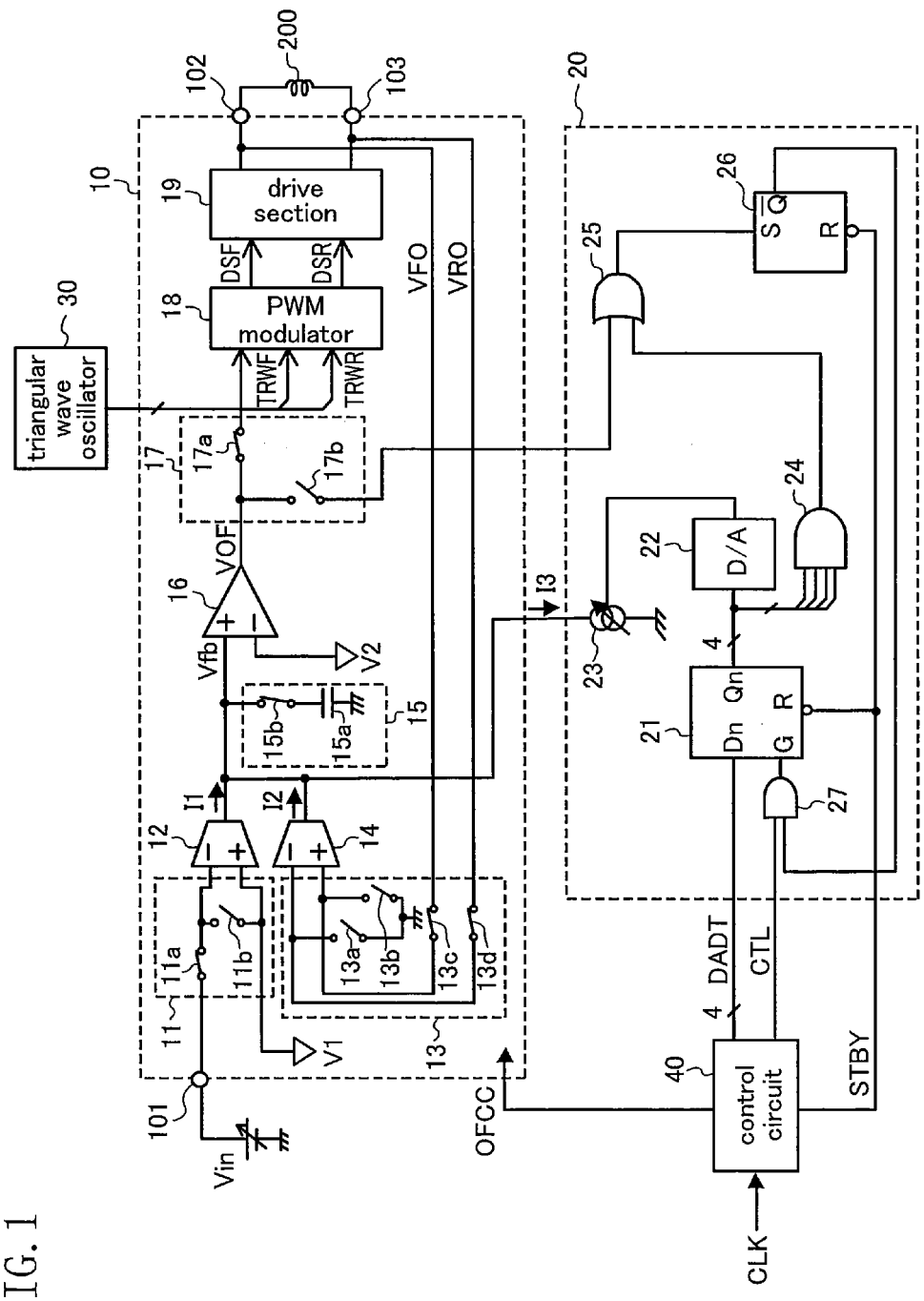
FIG. 1 is a diagram showing a structure of a PWM drive apparatus according to a first embodiment.

FIG. 1 shows a structure of a PWM drive apparatus according to a first embodiment. The PWM drive apparatus comprises a PWM driver 10, an offset correcting circuit 20, a triangular wave oscillator 30, and a control circuit 40.

Firstly, a detailed structure of the PWM driver 10 will be described. A command voltage Vin applied to an input terminal 101 and a reference voltage V1 are input via a switch circuit 11 to a negative input terminal and a positive input terminal of a differential-input voltage-to-current converter 12, respectively. The voltage-to-current converter 12 converts a difference voltage between the positive and negative input terminals into a current I1. Voltages VFO and VRO of positive and negative output terminals 102 and 103 are input via a switch circuit 13 to a positive input terminal and a negative input terminal of a differential-input voltage-to-current converter 14, respectively. The voltage-to-current converter 14 converts a difference voltage between the positive and negative input terminals into a current I2. Thus, the voltage-to-current converter 14 forms a negative feedback circuit of the PWM driver 10.

The switch circuit 11 comprises two switches 11a and 11b. These switches 11a and 11b are controlled in accordance with a signal OFCC which is output from the control circuit 40. Specifically, when the signal OFCC is at the L level (normal mode), the switch 11a is closed and the switch 11b is open, so that a voltage Vin-V1 is applied between the positive and negative input terminals of the voltage-to-current converter 12. On the other hand, when the signal OFCC is at the H level (correction mode), the switch 11a is open and the switch 11b is closed, so that a voltage between the positive and negative input terminals of the voltage-to-current converter 12 is zero. The switch 11a is provided so as to prevent the input terminal 101 and a supply node of the reference voltage V1 from being short-circuited in the correction mode.

The switch circuit 13 comprises four switches 13a, 13b, 13c and 13d. These switches 13a to 13d are also controlled in accordance with the signal OFCC. Specifically, in the normal mode, the switches 13c and 13d are closed and the switches 13a and 13b are open, so that a voltage VFO-VRO is applied between the positive and negative input terminals of the voltage-to-current converter 14. On the other hand, in the correction mode, the switches 13c and 13d are open and the switches 13a and 13b are closed, so that the voltage between the positive and negative input terminals of the voltage-to-current converter 14 is zero. The switches 13c and 13d are provided so as to prevent the output terminal 102 and the output terminal 103 from being short-circuited in the correction mode.

Output terminals of the voltage-to-current converters 12 and 14 are connected together, and a low-pass filter 15 is connected to the connection point. A voltage Vfb at the connection point and a reference voltage V2 are input to a positive input terminal and a negative input terminal of a differential-input amplifier 16, respectively. A PWM modulator 18 PWM-modulates an output voltage VOF of the amplifier 16 which is received via a switch circuit 17, using two triangular waves TRWF and TRWR which are output from the triangular wave oscillator 30 and have phases which are deviated by 180° from each other. A drive section 19 drives a load 200 by supplying voltages to the positive and negative output terminals 102 and 103 in accordance with PWM-modulated signals DSF and DSR, respectively. The drive section 19 comprises a general H-bridge circuit or the like.

The low-pass filter 15 comprises a capacitor 15a and a switch 15b. The switch 15b is also controlled in accordance with the signal OFCC. Specifically, in the normal mode, the switch 15b is closed, so that the capacitor 15a is connected to the connection point of the output terminals of the voltage-to-current converters 12 and 14. On the other hand, in the correction mode, the switch 15b is open, so that the capacitor 15a is cut off from the connection point of the output terminals of the voltage-to-current converters 12 and 14. The capacitor 15a is charged by the output currents I1 and I2 of the voltage-to-current converters 12 and 14 and a correction current I3 which is supplied from the offset correcting circuit 20, to generate the voltage Vfb. Thus, the low-pass filter 15 adds the current I2 corresponding to the feedback voltage VFO- VRO to the current I1 corresponding to the command voltage Vin having an inverted polarity (negative feedback process), and smoothes the sum current to generate a voltage (integration process), and in addition, removes harmonic noise components which occur due to the PWM control. The switch 15b is provided so as to prevent currents output by the voltage-to-current converters 12 and 14 in the correction mode from being smoothed by the capacitor 15a. Note that the switch 15b may be removed.

The amplifier 16 amplifies the voltage Vfb with a predetermined gain into an output of up to about several volts in the normal mode. On the other hand, in the correction mode, the capacitor 15a is electrically cut off, so that the voltage Vfb is generated by an input impedance of the amplifier 16. Since the input impedance of the amplifier 16 is generally $10^6 \Omega$ or more, a voltage of several volts is generated when a current of about $10^{-6}$ A only flows into the amplifier 16. Therefore, in the correction mode, the output voltage of the amplifier 16 is saturated in the vicinity of either a power supply voltage or a ground voltage. Therefore, the amplifier 16 operates as a comparator in the correction mode. Specifically, the amplifier 16 outputs "H" (e.g., +VCC) when the voltage Vfb is larger than the reference voltage V2, and "L" (e.g., zero) when the voltage Vfb is smaller than the reference voltage V2. Note that the ground voltage may be applied to the negative input terminal of the amplifier 16 instead of the reference voltage V2. In this case, the amplifier 16 outputs a negative power supply voltage (e.g., −VCC) as "L".

The switch circuit 17 comprises two switches 17a and 17b. These switches 17a and 17b are also controlled in accordance with the signal OFCC. Specifically, in the normal mode, the switch 17a is closed and the switch 17b is open, so that the output voltage VOF of the amplifier 16 is applied to the PWM modulator 18. On the other hand, in the correction mode, the switch 17a is open and the switch 17b is closed, so that the amplifier 16 is cut off from the PWM modulator 18, and instead, is connected to the offset correcting circuit 20. Thus, the output voltage VOF of the amplifier 16 is applied to the offset correcting circuit 20. The switch 17a is provided so as to prevent the load 200 from being accidentally operated in the correction mode. By opening the switch 17a, the control of the load 200 can be canceled. Note that the supply of power to the load 200 may be canceled by interrupting the triangular waves TRWF and TRWR, interrupting the signals DSF and DSR, or interrupting the supply of power to the PWM modulator 18 or the drive section 19 in the correction mode.

Figure 2:
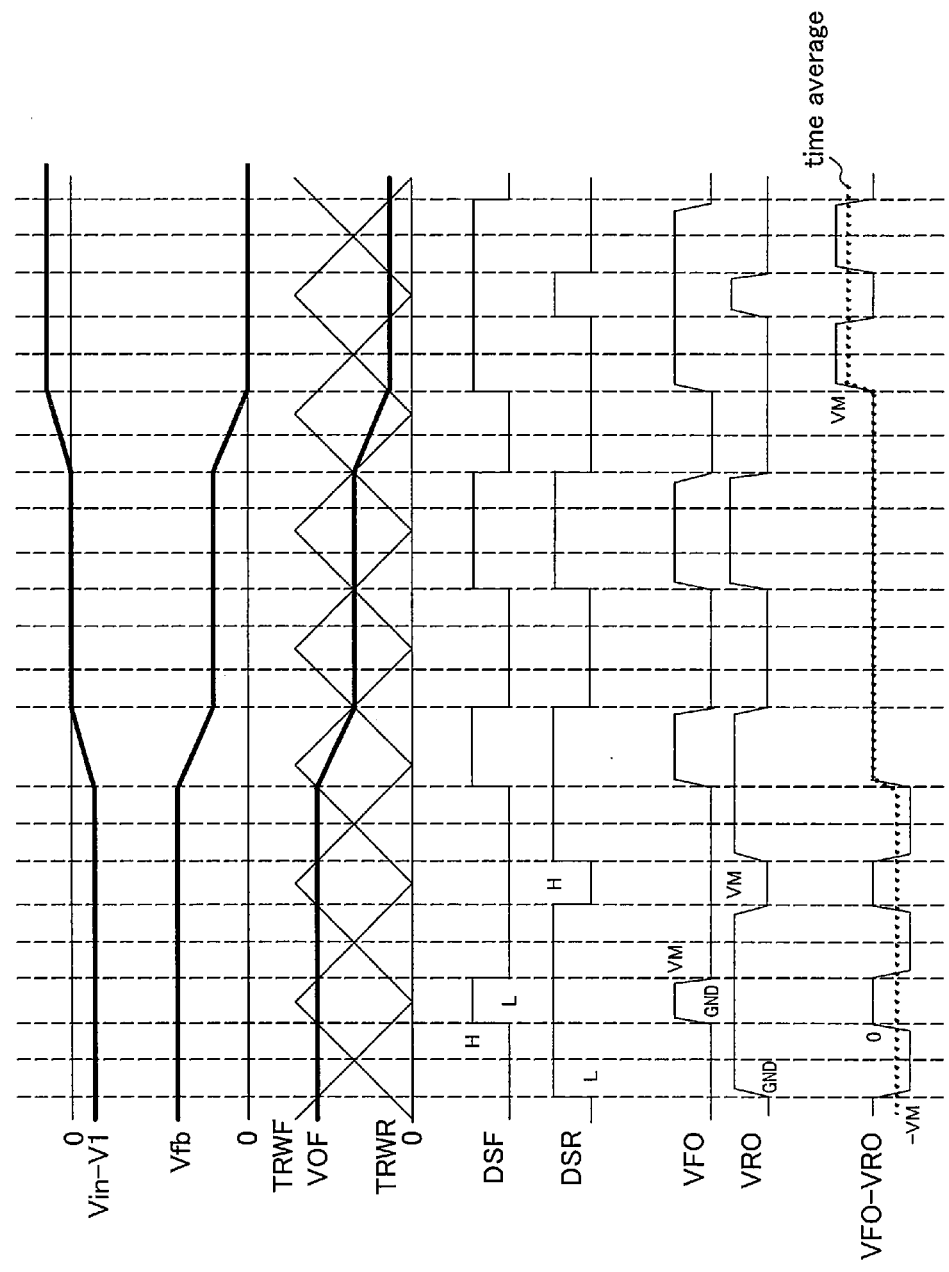
FIG. 2 is a diagram showing waveforms of signals in a PWM driver of FIG. 1 during an operation in the normal mode.

FIG. 2 shows waveforms of signals in the PWM driver 10 during an operation in the normal mode. With the triangular waves TRWF and TRWR, the output voltage VOF of the amplifier 16 is PWM-modulated, so that the PWM-modulated voltages VFO and VRO are finally generated. Note that a power supply voltage of the drive section 19 is indicated by VM. An average drive voltage which is obtained by time-averaging the voltage VFO-VRO applied to the load 200 over a PWM cycle has a waveform similar to that of the command voltage Vin.

Figure 3:
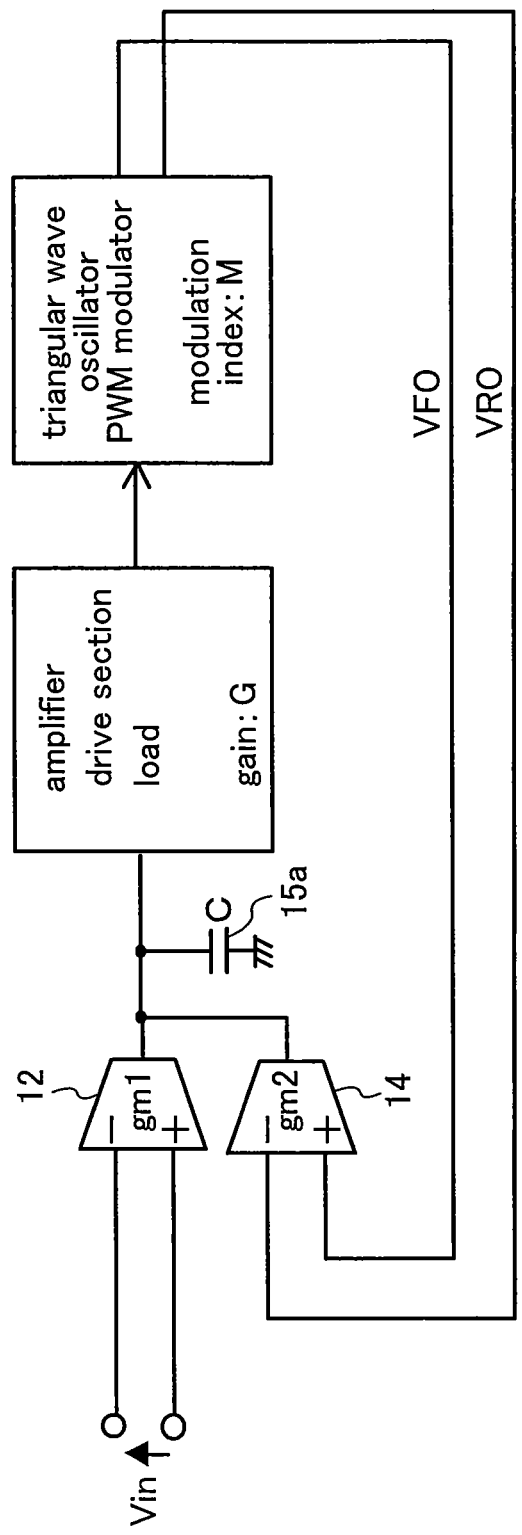
FIG. 3 is an equivalent circuit diagram of the PWM driver of FIG. 1 during an operation in a normal mode.

FIG. 3 equivalently represents the PWM driver 10 during an operation in the normal mode using two blocks, i.e., a gain block having a gain G which includes the amplifier 16, the drive section 19 and the load 200, and a modulation index block having a modulation index M ($0 \leq M \leq 1$) which includes the triangular wave oscillator 30 and the PWM modulator 18. A closed loop gain $G_{close}$ of the PWM driver 10 is represented by:

$$G_{close} = \frac{VFO - VRO}{Vin} = \frac{\frac{gm1}{gm2}}{1 - \frac{C \cdot s}{gm2 \cdot GM}} \approx \frac{gm1}{gm2} \left( \frac{C}{gm2 \cdot GM} \ll 1 \right)$$

where gm1 represents the transconductance of the voltage-to-current converter 12, gm2 represents the transconductance of the voltage-to-current converter 14, and C represents the capacitance value of the capacitor 15a in the low-pass filter 15.

Thus, the closed loop gain of the PWM driver 10 is approximately determined by the transconductance ratio of the voltage-to-current converters 12 and 14.

Figure 11:
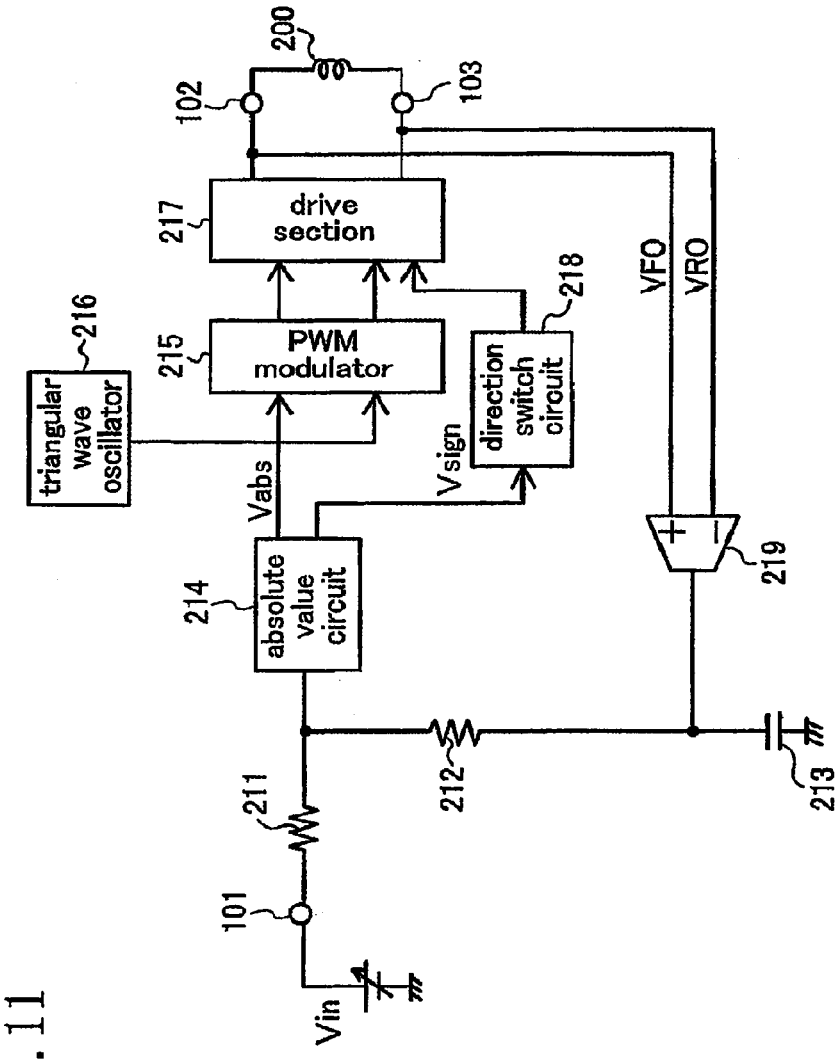
FIG. 11 is a diagram showing the structure of a conventional PWM drive apparatus.
Figure 12:
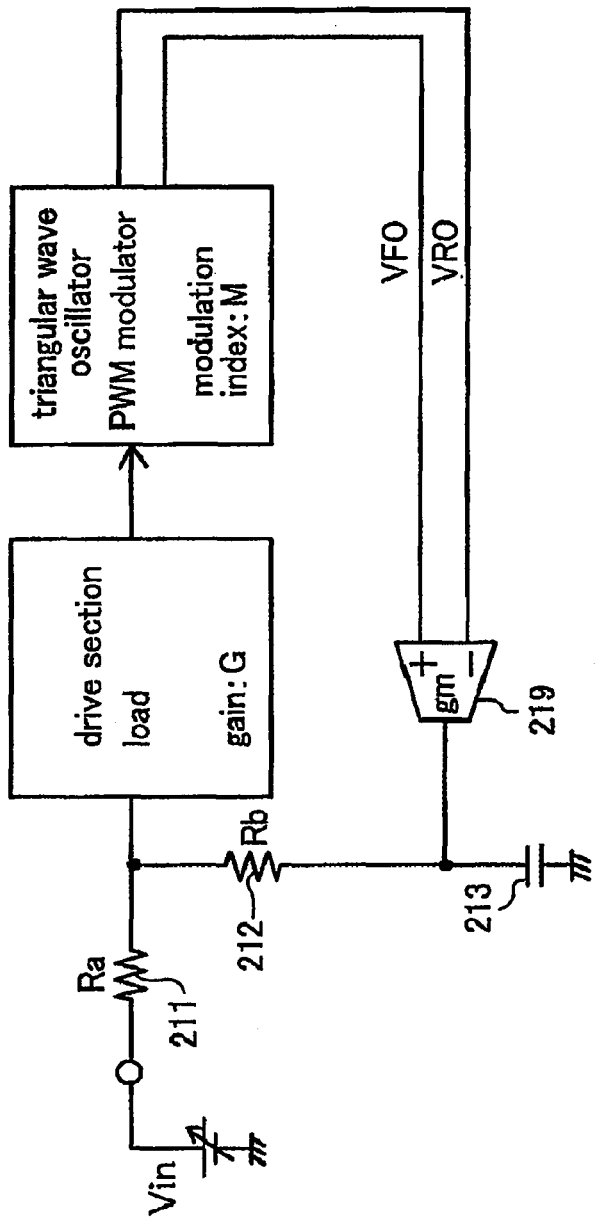
FIG. 12 is an equivalent circuit diagram of the PWM drive apparatus of FIG. 11.

In general, the transconductance of a voltage-to-current converter varies, depending on the operating temperature of a semiconductor circuit included in the voltage-to-current converter. Therefore, for example, by providing the voltage-to-current converters 12 and 14 close to each other on a semiconductor chip, the change rates of the transconductances gm1 and gm2 due to a temperature change or the like can be caused to be substantially the same. Therefore, the PWM driver 10 can operate with a gain which is more stable than that of the PWM drive apparatus of FIG. 11.

Figure 4:
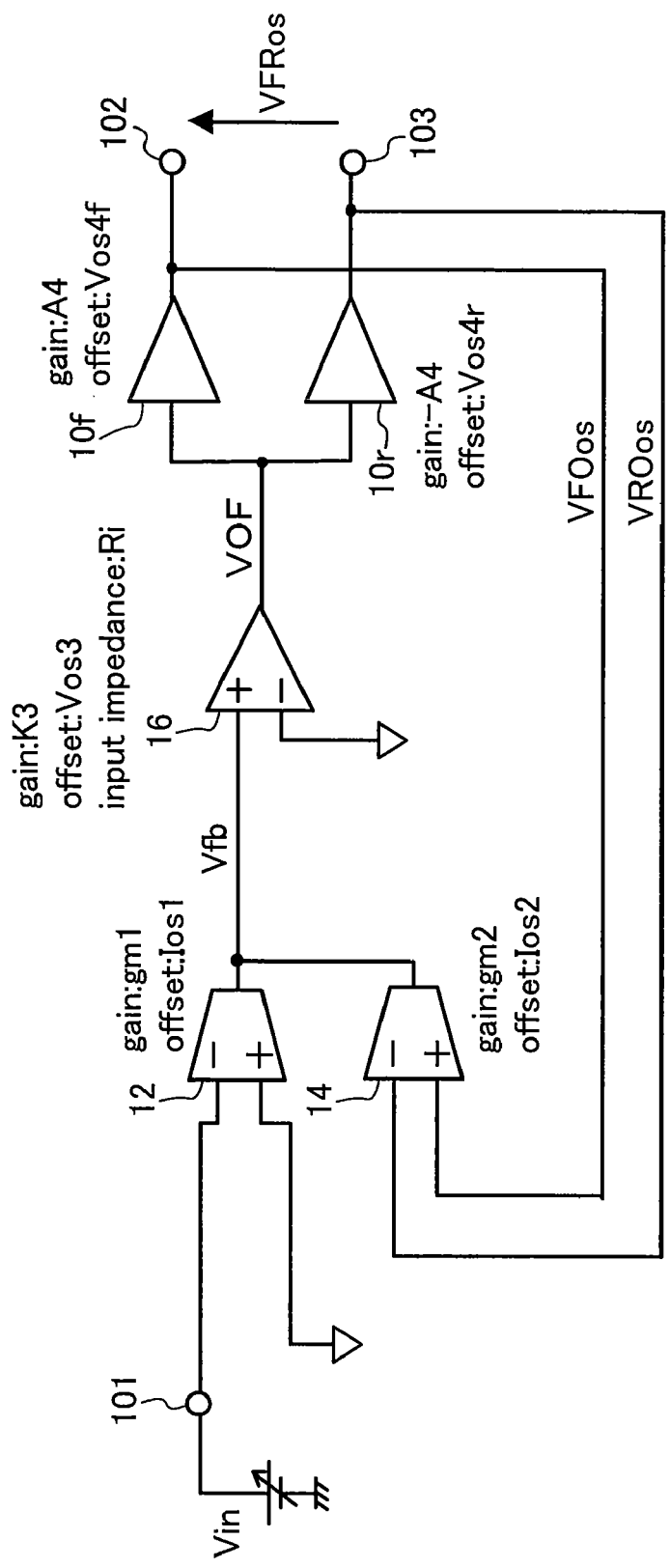
FIG. 4 is an equivalent circuit diagram of the PWM driver of FIG. 1, where an attention is paid to an offset voltages and currents.

On the other hand, a number of differential-input elements are employed in the PWM driver 10. Offset voltages and currents of these elements are likely to have an influence on the output of the PWM drive apparatus. FIG. 4 equivalently represents the PWM driver 10, where an attention is paid to the offset voltages and currents. Gain blocks 10f and 10r are blocks for the output terminals 102 and 103, respectively, each of which includes the triangular wave oscillator 30, the PWM modulator 18, the drive section 19, and the load 200 (drive sub-system), where the drive sub-system is assumed to perform a quasi-linear operation. Also, since only a direct-current operation is considered when an attention is paid to offset, the capacitor 15a in the low-pass filter 15 is assumed to be absent. Now, the offset current of the voltage-to-current converter 12 is represented by Ios1, the offset current of the voltage-to-current converter 14 is represented by Ios2, the gain, offset voltage, and input impedance of the amplifier 16 are represented by K3, Vos3, and Ri, respectively, the gain and offset voltage of the gain block 10f are represented by A4 and Vos4f, the gain and offset voltage of the gain block 10r are represented by −A4 and Vos4r, the offset voltage of the output terminal 102 is represented by VFOos, and the offset voltage of the output terminal 103 is represented by VROos. A relational expression of the voltage Vfb at the output terminal of the voltage-to-current converters 12 and 14 is solved for an output offset voltage VFRos (=VFOos−VROos), and the mean square value of the components is calculated, resulting in the following expression, though a detail of the calculation is not specified. Note that the input impedance Ri of the amplifier 16 is assumed to be extremely larger than the other terms.

$$VFOos = VFOos - VROos = \frac{\sqrt{Ios1^2 + Ios2^2}}{2 \cdot gm2}$$

Thus, since the PWM driver 10 is a feedback circuit, the output offset voltage VFRos is not affected by the amplifier 16 or the gain blocks 10f and 10r, and is mainly affected by the offset currents of the voltage-to-current converters 12 and 14.

The output offset voltage VFRos represented by the expression above is the result of analysis where the drive sub-system is assumed to perform a linear operation. Nevertheless, in an actual PWM drive apparatus, if the output voltage is time-averaged over the cycle of the triangular waves TRWF and TRWR, the presence of an offset voltage can be confirmed.

Next, a detailed structure of the offset correcting circuit 20 will be described. The offset correcting circuit 20 is used so as to correct an output offset caused by the offset currents of the voltage-to-current converters 12 and 14. A latch circuit 21 updates an output value with a value represented by a 4-bit signal DADT output from the control circuit 40 when a gate input is at the H level (tracking operation), and holds the output value when the gate input is at the L level (holding operation). Also, the latch circuit 21 is reset by logical inversion of a signal STBY output from the control circuit 40. Specifically, the latch circuit 21 is operated only when the signal STBY is at the H level. A D/A converter 22 operates as a current control section which controls a supply current of a variable current source 23 in accordance with the output value of the latch circuit 21. The variable current source 23 is connected to the connection point of the output terminals of the voltage-to-current converters 12 and 14, and supplies, to the connection point, a source current or a sink current (correction current I3) having a magnitude corresponding to the output value of the latch circuit 21. Specifically, the variable current source 23 can be comprised of a voltage control current source. Note that, by employing a digital control current source as the variable current source 23, the D/A converter 22 can be removed and the supply current of the variable current source 23 can be directly controlled by the latch circuit 21.

The 4-bit output signal of the latch circuit 21 is also input to an AND gate 24 and is subjected to logical multiplication thereof. The result of the calculation and the output signal (voltage VOF) of the amplifier 16 input via the switch circuit 17 are input to an OR gate 25 to calculate logical addition thereof. The result of the calculation is used as a set input of an RS flip-flop 26. The RS flip-flop 26 is also reset by logical inversion of the signal STBY. Specifically, the RS flip-flop 26 is operated only when the signal STBY is at the H level. The inverted output of the RS flip-flop 26 and a signal CTL output from the control circuit 40 are input to an AND gate 27 to calculate logical multiplication thereof. The result of the calculation is a gate input of the latch circuit 21. Specifically, the RS flip-flop 26 is set and instructs the latch circuit 21 to latch a 4-bit input value when the output signal of the amplifier 16 is at the H level or the 4-bit output value of the latch circuit 21 is the upper limit value of an adjustable range. Once the latch instruction is output, the 4-bit output value of the latch circuit 21 is maintained without being changed until the RS flip-flop 26 is reset.

The control circuit 40 is operated in synchronization with a clock signal CLK to output the signal OFCC, the signal DADT, the signal CTL, and the signal STBY. The signal OFCC is used to designate an operating mode of the PWM drive apparatus. The signal DADT is a 4-bit count signal. The signal DADT can be generated by counting the clock signal CLK. The signal CTL is used to instruct the latch circuit 21 to perform a tracking operation and a holding operation. The signal CTL can be generated by frequency-dividing the clock signal CLK. Note that the signal CTL is output after a lapse of a period of time required for the voltage-to-current converters 12 and 14, the variable current source 23, and the like to become stable after activation of the PWM drive apparatus (settling period). The signal STBY is used to instruct the latch circuit 21 and the RS flip-flop 26 in the offset correcting circuit 20 to operate and stop.

Figure 5:
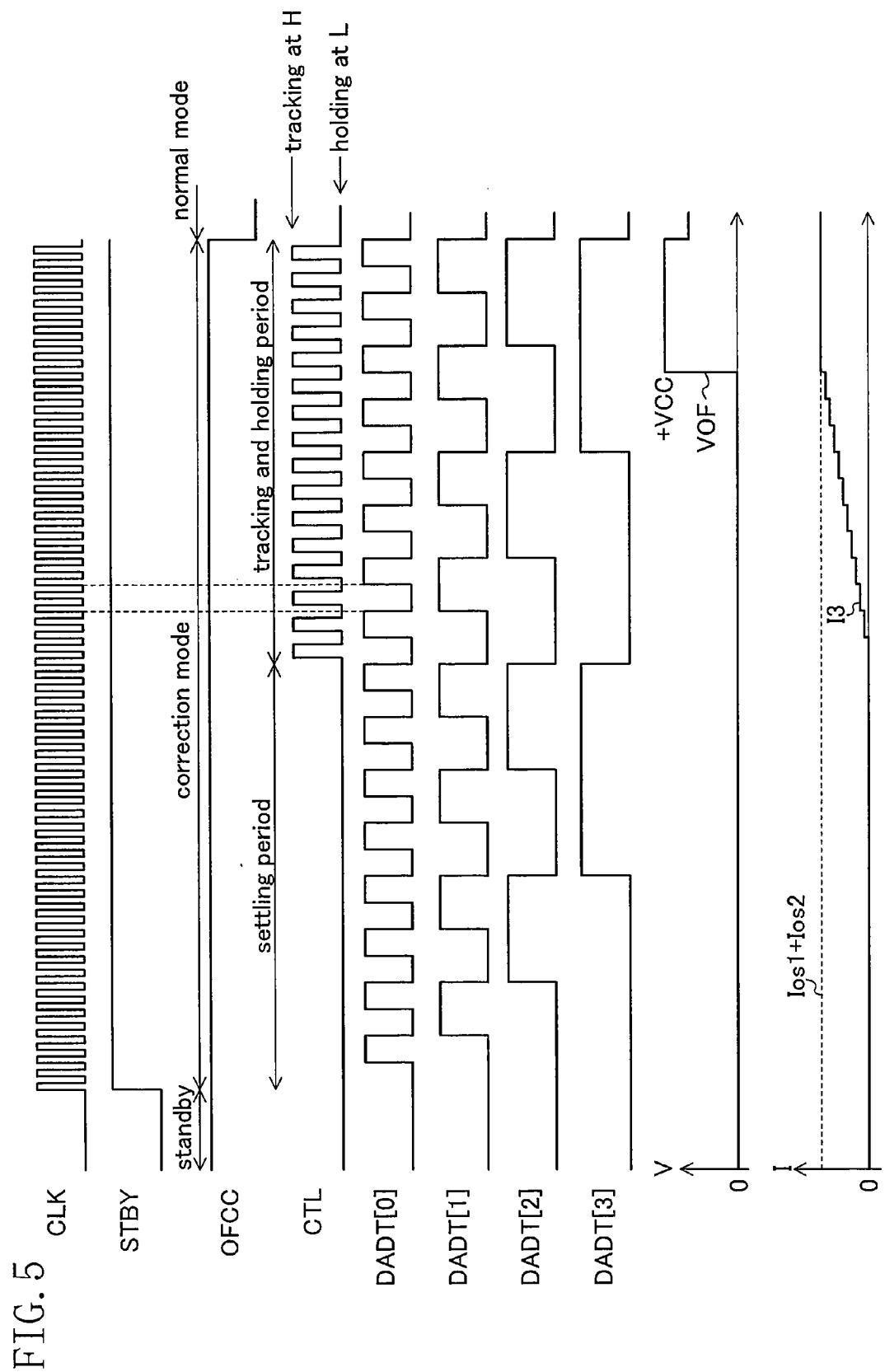
FIG. 5 is a timing chart of the PWM driver of FIG. 1.

Next, an offset correcting operation of the PWM drive apparatus will be described with reference to a timing chart of FIG. 5. When the signal STBY goes to the H level, the PWM drive apparatus initially starts operating in the correction mode. After a lapse of the settling period, a value represented by the signal DADT is counted up from the initial value (zero) during a tracking and holding period. Since the output voltage VOF of the amplifier 16 is zero (L level) at the start of activation, the inverted output of the RS flip-flop 26 is at the H level, so that the tracking and holding operations of the latch circuit 21 are controlled in accordance with the signal CTL. Specifically, when a pulse of the signal CTL is output during counting up of the signal DADT, the latch circuit 21 updates and holds the 4-bit value represented by the signal DADT.

In this case, a signal DADT[0] which is the LSB of the signal DADT and the signal CTL are obtained by ¼-frequency dividing and ½-frequency dividing of the clock signal CLK, respectively. Further, edges of the signal CTL and the signal DADT[0] are deviated from each other. If the signal CTL and the signal DADT have the same edge timing, it is likely that the variable current source 23 supplies an excessively large correction current I3 due to glitch noise which occurs when the signal DADT is latched, so that the output of the amplifier 16 is inverted by the noise current, and therefore, the RS flip-flop 26 is incorrectly set. In contrast to this, by deviating edges of the signal CTL and the signal DADT from each other, glitch noise which causes the above-described incorrect operation can be suppressed.

As a value latched by the latch circuit 21 increases, the correction current I3 also gradually increases. When the correction current I3 becomes equal to the sum value of the offset currents Ios1 and Ios2 of the voltage-to-current converters 12 and 14, these offset currents Ios1 and Ios2 are canceled by the correction current I3, so that the output voltage VOF of the amplifier 16 becomes +VCC (H level). Thereby, the RS flip-flop 26 is set, and the latch circuit 21 holds a signal DADT at that time. Thereafter, even if the signal DADT is changed, the output value of the latch circuit 21 is not updated, and the correction current I3 supplied from the variable current source 23 is also fixed. Thereafter, when the tracking and holding period is ended, the signal OFCC goes to the L level, so that the PWM drive apparatus goes from the operating mode to the normal mode. In the normal mode, the variable current source 23 continues to supply the correction current I3 which just cancels the offset currents Ios1 and Ios2. Thereby, the PWM drive apparatus can be normally operated in a state in which the output offset is canceled.

Even if the value held by the latch circuit 21 becomes maximum, but the sum value of the offset currents Ios1 and Ios2 is not equal to the correction current I3, the output of the AND gate 24 goes to the H level, so that the RS flip-flop 26 is set, and the output value of the latch circuit 21 is fixed to the maximum value. Thereby, a maximum source current or sink current within a controllable range is supplied from the variable current source 23, so that the output offset of the PWM drive apparatus is reduced to the extent possible. On the other hand, if the output voltage VOF of the amplifier 16 is +VCC (H level) at the start of the correction mode, the RS flip-flop 26 is set, so that the output value of the latch circuit 21 is fixed and remains at the initial value (zero). The reason why the control amount with respect to the variable current source 23 is maintained at the initial value is that, if the supply current of the variable current source 23 is changed, the output offset of the PWM drive apparatus is likely to increase. Note that a product in which the output level of the amplifier 16 is "H" at the start of the correction mode is highly likely to be defective. Therefore, by observing the output level of the amplifier 16 at the start of the correction mode, it is possible to determine pass or fail of each product, and further determine a defective lot.

Second Embodiment

Figure 6:
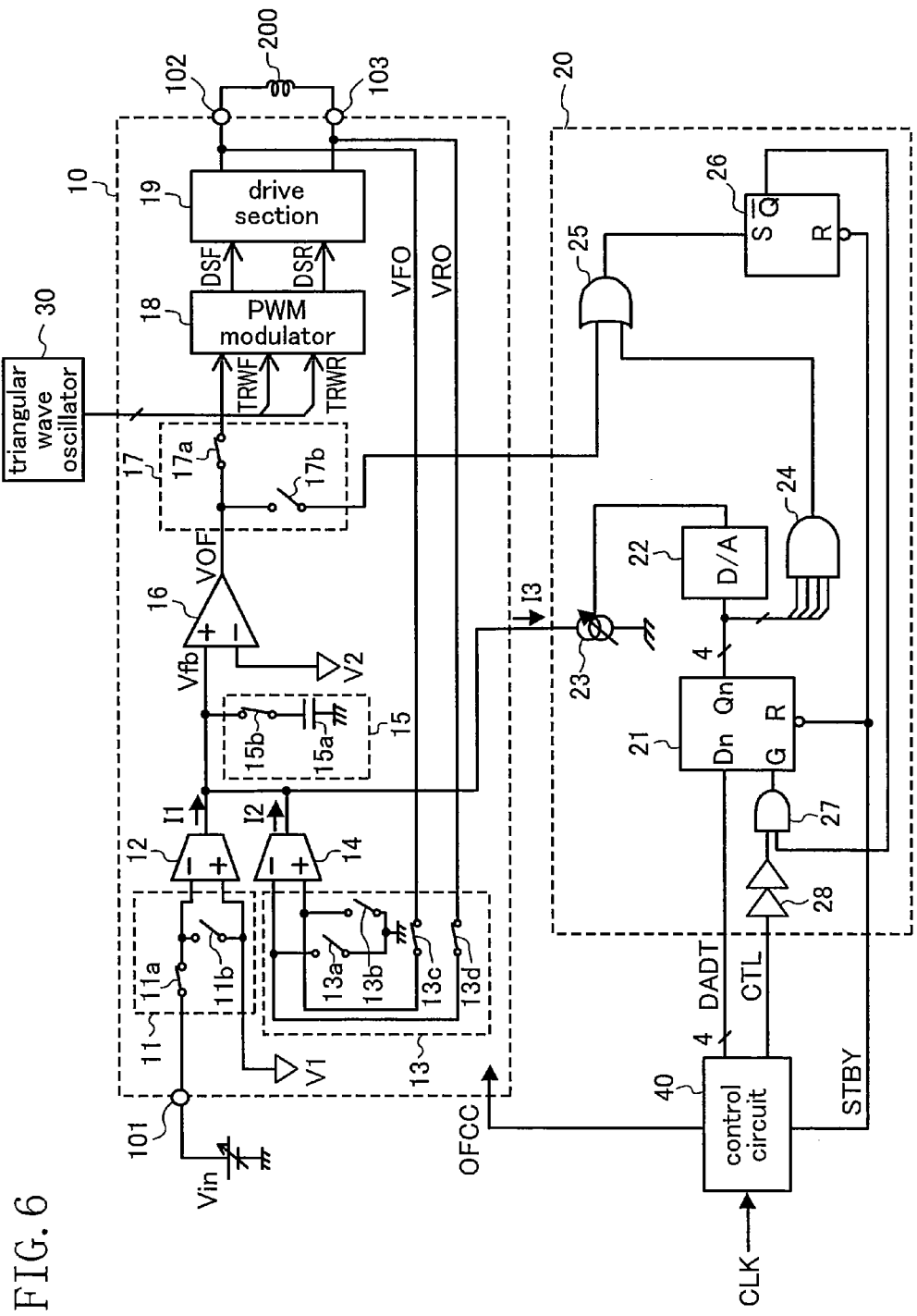
FIG. 6 is a diagram showing a structure of a PWM drive apparatus according to a second embodiment.

FIG. 6 shows a structure of a PWM drive apparatus according to a second embodiment. This PWM drive apparatus is obtained by adding a delay circuit 28 to the offset correcting circuit 20 of FIG. 1. The delay circuit 28 is provided between the control circuit 40 and the AND gate 27 so as to delay the signal CTL output from the control circuit 40.

Figure 7:
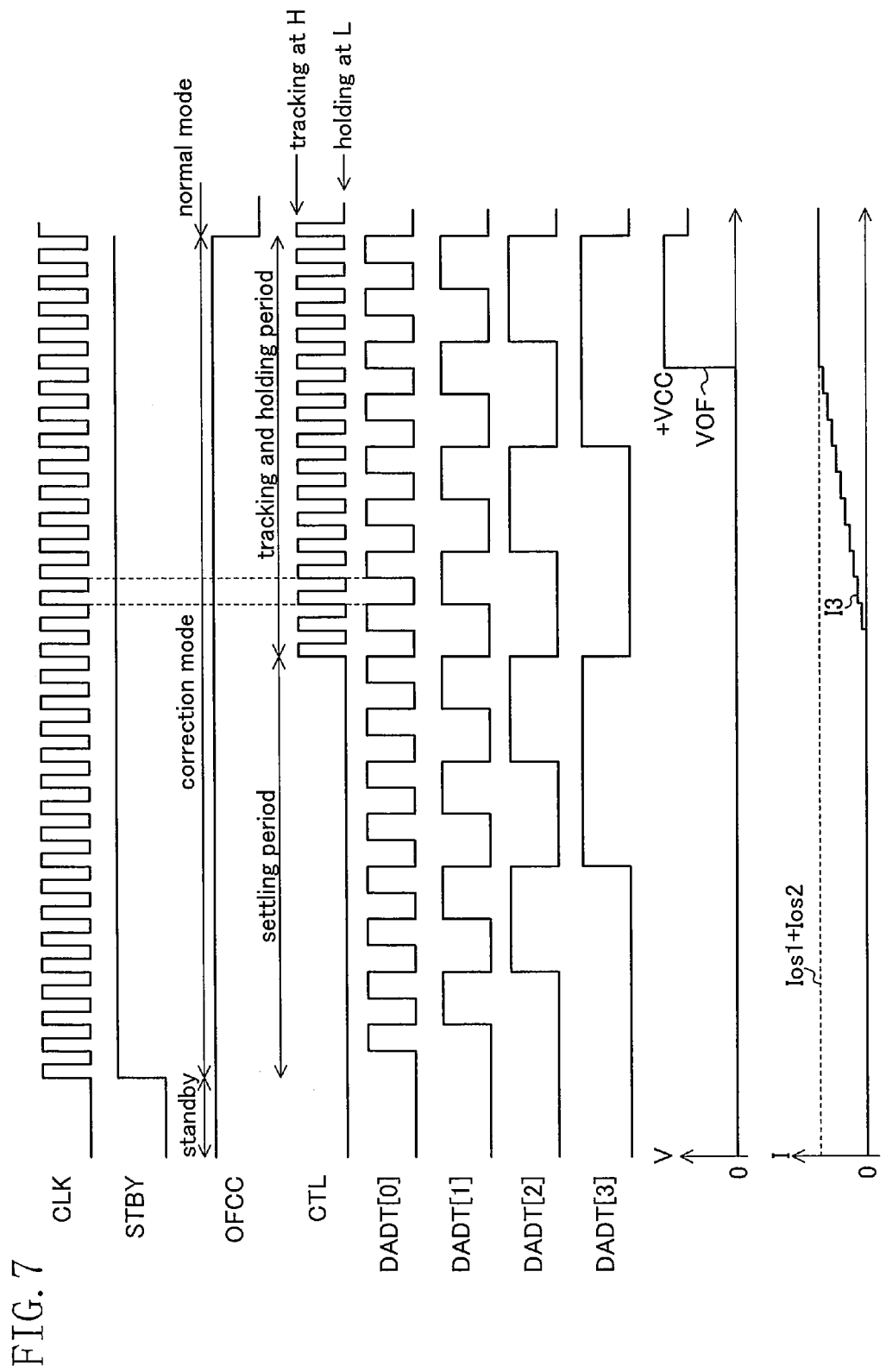
FIG. 7 is a timing chart of the PWM driver of FIG. 6.

FIG. 7 is a timing chart of the PWM drive apparatus. A difference from the PWM drive apparatus of FIG. 1 is that the signal CTL matches the clock signal CLK. Specifically, the signal CTL is obtained by performing a gate control with respect to the clock signal CLK. The structure of a portion for generating the signal CTL of the control circuit 40 can be further simplified than in the first embodiment in which the signal CTL is obtained by ½-frequency dividing the clock signal CLK. In this embodiment, the signal CTL and the signal DADT have the same edge timing. Nevertheless, by delaying the signal CTL using the delay circuit 28, the edge timing of a data input and the edge timing of a gate input of the latch circuit 21 are deviated from each other, so that glitch noise can be suppressed.

Third Embodiment

Figure 8:
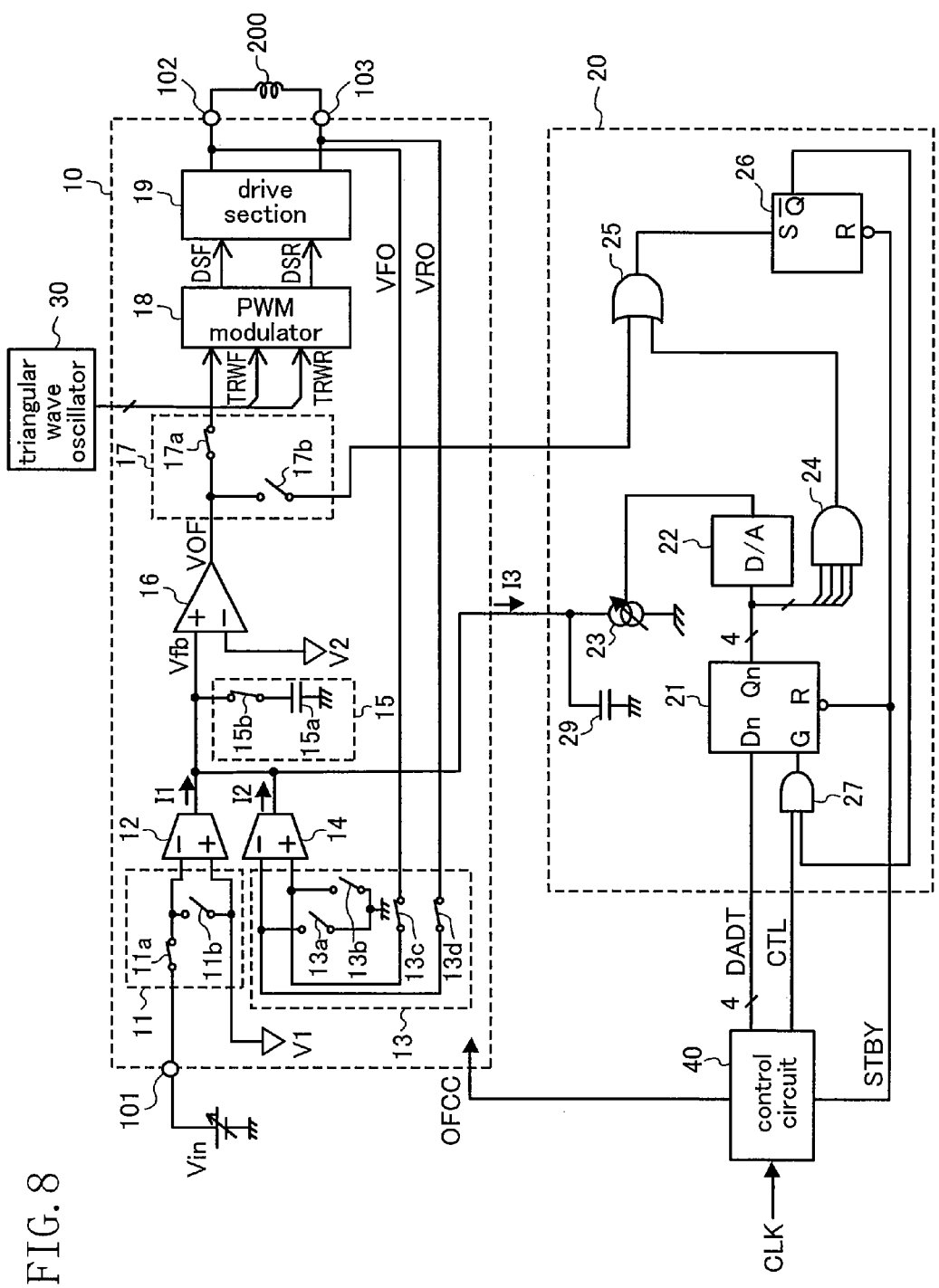
FIG. 8 is a diagram showing a structure of a PWM drive apparatus according to a third embodiment.

FIG. 8 shows a structure of a PWM drive apparatus according to a third embodiment. This PWM drive apparatus is obtained by adding a capacitor 29 to the offset correcting circuit 20 of FIG. 1. The capacitor 29 is connected to the connection point of the output terminals of the voltage-to-current converters 12 and 14.

The operation timing of the PWM drive apparatus is the same as that of FIG. 7. Specifically, the signal CTL is obtained by performing a gate control with respect to the clock signal CLK. Therefore, although a noise current occurs in the variable current source 23 due to glitch noise which occurs during a latch operation by the latch circuit 21, the noise current is absorbed by the capacitor 29. Therefore, the output of the amplifier 16 is not incorrectly inverted, so that the PWM drive apparatus can be normally operated in the correction mode.

Fourth Embodiment

Figure 9:
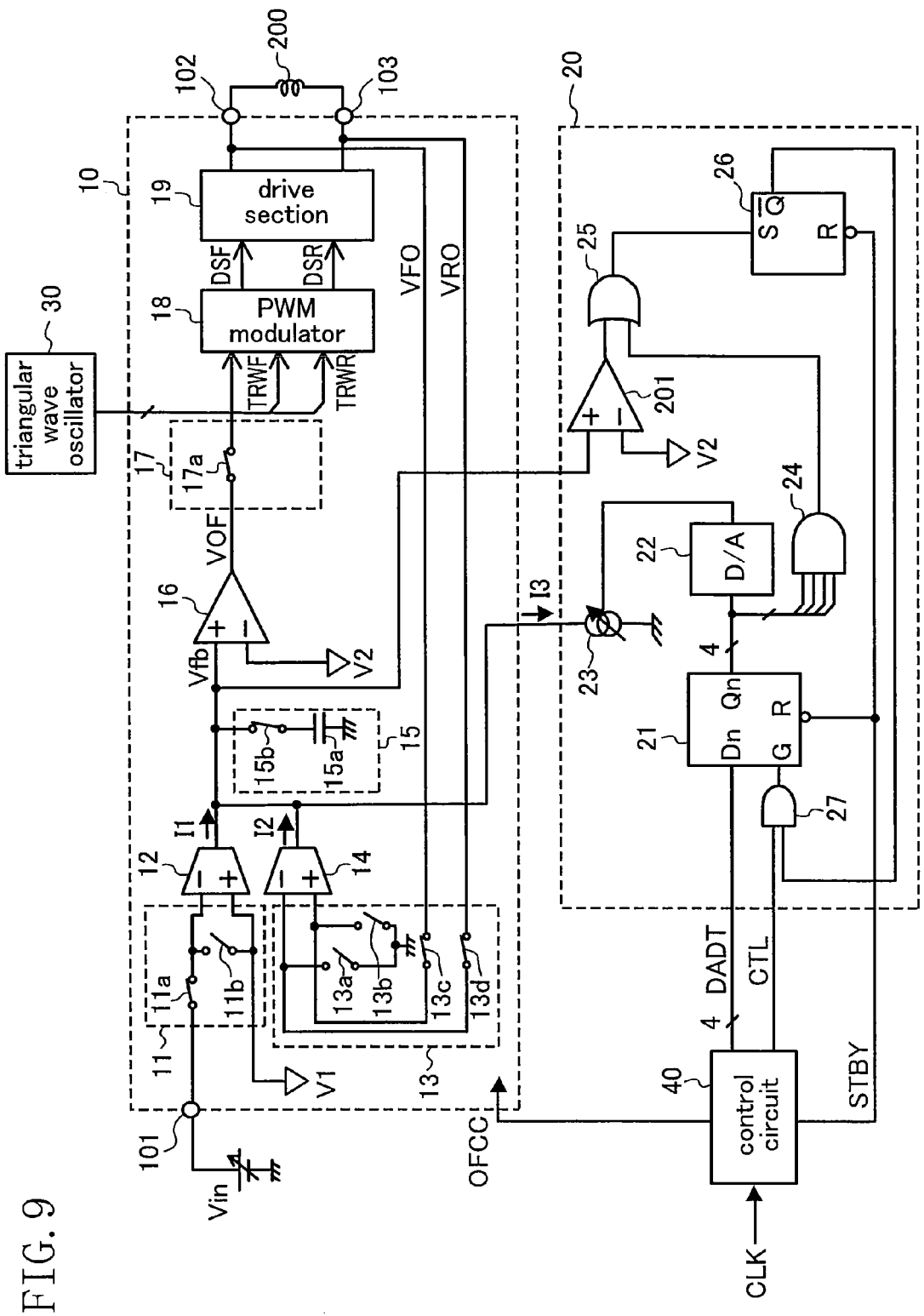
FIG. 9 is a diagram showing a structure of a PWM drive apparatus according to a fourth embodiment.

FIG. 9 shows a structure of a PWM drive apparatus according to a fourth embodiment. This PWM drive apparatus is obtained by adding a comparator 201 to the offset correcting circuit 20 of FIG. 1 and removing the switch 17b from the switch circuit 17 in the PWM driver 10. The comparator 201 receives, at positive and negative input terminals thereof, the voltage Vfb at the connection point of the voltage-to-current converters 12 and 14 and the reference voltage V2. An output of the comparator 201 is input to the OR gate 25. Thus, even when the amplifier 16 is not used as a comparator, and the comparator 201 for comparing the magnitudes of the voltage Vfb and the reference voltage V2 is separately and independently provided, the offset correcting effect of the present invention is not impaired.

Fifth Embodiment

Figure 10:
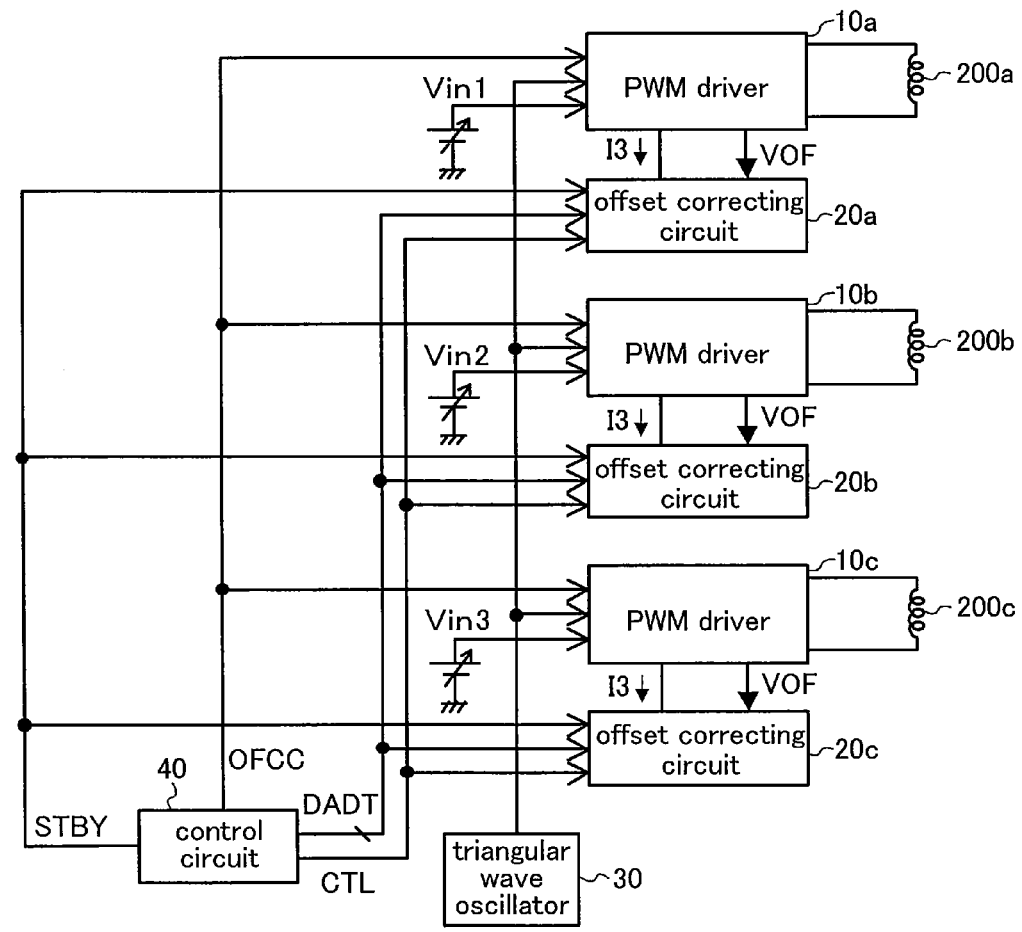
FIG. 10 is a diagram showing a structure of a PWM drive apparatus according to a fifth embodiment.

FIG. 10 shows a structure of a drive system according to a fifth embodiment. The drive system comprises three PWM drivers 10a, 10b and 10c, three offset correcting circuits 20a, 20b and 20c corresponding thereto, a triangular wave oscillator 30, and a control circuit 40. Details of these parts have been described above.

The PWM drivers 10a to 10c receive command voltages Vin1, Vin2 and Vin3, respectively, and drive loads 200a, 200b and 200c which are independent from each other. The triangular wave oscillator 30 supplies a triangular wave to the PWM drivers 10a to 10c in common. The control circuit 40 outputs the signals OFCC, STBY, DADT and CTL to the PWM drivers 10a to 10c or the offset correcting circuits 20a to 20c in common.

Thus, in the drive system which comprises a plurality of PWM drive apparatuses which are independent from each other, switching between the correction mode and the normal mode and a control in the correction mode can be performed in common by the plurality of PWM drive apparatuses. Therefore, a plurality of PWM drive apparatuses share the single triangular wave oscillator 30 and the single control circuit 40, so that the size and cost of a drive system for driving a plurality of loads can be reduced.

Although it has been assumed in the embodiments above that the control range of a supply current of the variable current source 23 is 4 bits, any number of bits can be adjusted. Also, the correction-mode operation is not limited to when the device is started up, and the device may be switched to the correction mode as required during an operation of the device.

Logical processing portions of the control circuit 40 and the offset correcting circuit 20 can be achieved by a software control of a microcomputer. Although it has been assumed in the embodiments above that the offset correcting circuit 20 is controlled in accordance with a digital signal (signal DADT), the offset correcting circuit 20 may be controlled in accordance with an analog signal using a triangular wave oscillator, a comparator, a sample hold circuit, and the like as required.

What is claimed is:

1. A PWM drive apparatus for driving a load by a PWM control, depending on a command voltage, comprising:
    a first voltage-to-current converter for converting a difference voltage between the command voltage and a reference voltage into a current;
    a second voltage-to-current converter for converting a difference voltage between a positive output terminal and a negative output terminal of the PWM drive apparatus into a current;
    a low-pass filter connected to a connection point between an output terminal of the first voltage-to-current converter and an output terminal of the second voltage-to-current converter;
    an amplifier for amplifying a difference voltage between a voltage at the connection point and a reference voltage;
    a PWM modulator for PWM-modulating an output voltage of the amplifier; and
    a drive section for driving the load in accordance with an output signal of the PWM modulator.

2. The PWM drive apparatus of claim 1, further comprising:

a first switch circuit for switching between short-circuiting and opening of positive and negative input terminals of the first voltage-to-current converter;

a second switch circuit for switching between short-circuiting and opening of positive and negative input terminals of the second voltage-to-current converter;

an offset correcting circuit having a variable current source connected to the connection point; and a control circuit for controlling the first and second switch circuits and the offset correcting circuit, wherein, in a correction mode, the control circuit causes the first and second switch circuits to short-circuit the positive and negative input terminals of the first and second voltage-to-current converters, and the offset correcting circuit gradually changes a control amount with respect to the variable current source, from an initial value thereof, in accordance with an instruction from the control circuit, to determine a correction current to be supplied to the connection point, and in a normal mode, the control circuit causes the first and second switch circuits to open between the positive and negative input terminals of the first and second voltage-to-current converters, and the offset correcting circuit supplies the determined correction current to the connection point.

3. The PWM drive apparatus of claim 2, wherein in the correction mode, the offset correcting circuit, when detecting that an output of the amplifier goes from a first logic level to a second logic level, stores a control amount with respect to the variable current source at that time, and in the normal mode, the offset correcting circuit controls the variable current source with the stored control amount.

4. The PWM drive apparatus of claim 3, wherein the offset correcting circuit, when detecting that the output of the amplifier is at the second logic level at start of the correction mode, maintains the control amount with respect to variable current source at the initial value.

5. The PWM drive apparatus of claim 3, wherein in the correction mode, the offset correcting circuit, when detecting that the control amount with respect to the variable current source reaches an end-of-change value, maintains the control amount with respect to the variable current source at the end-of-change value.

6. The PWM drive apparatus of claim 3, wherein the control circuit outputs a digital signal indicating the control amount with respect to the variable current source, and a control signal indicating timing of holding the digital signal, and the offset correcting circuit has a latch circuit for latching the digital signal in accordance with the control signal, and a current control section for controlling a supply current of the variable current source in accordance with an output signal of the latch circuit.

7. The PWM drive apparatus of claim 6, wherein the control circuit deviates edges of the digital signal and the control signal from each other and outputs the resultant digital signal and control signal.

8. The PWM drive apparatus of claim 6, wherein the offset correcting circuit has a delay circuit for delaying the control signal.

9. The PWM drive apparatus of claim 6, wherein the offset correcting circuit has a capacitor connected to the connection point.

10. The PWM drive apparatus of claim 2, wherein the low-pass filter has:

a capacitor; and a switch for switching between short-circuiting and opening of the capacitor and the connection point, wherein, in the correction mode, the control circuit causes the switch to open between the capacitor and the connection point, and in the normal mode, the control circuit causes the switch to short-circuit the capacitor and the connection point.

11. The PWM drive apparatus of claim 2, wherein in the correction mode, the control circuit suspends power supply to the load.

12. The PWM drive apparatus of claim 2, wherein the offset correcting circuit has a comparator for comparing a voltage of the connection point and a reference voltage, in the correction mode, the offset correcting circuit, when detecting that an output of the comparator goes from a first logic level to a second logic level, stores a control amount with respect to the variable current source at that time, and in the normal mode, the offset correcting circuit controls the variable current source with the stored control amount.

13. A drive system comprising a plurality of the PWM drive apparatuses of claim 1, wherein each of the plurality of PWM drive apparatuses has:

a first switch circuit for switching between short-circuiting and opening of positive and negative input terminals of the first voltage-to-current converter; and a second switch circuit for switching between short-circuiting and opening of positive and negative input terminals of the second voltage-to-current converter;

the drive system comprises:

a plurality of offset correcting circuits having variable current sources connected to the connection points of the plurality of PWM drive apparatuses;

a triangular wave oscillator for supplying a triangular wave for PWM modulation to the PWM modulators of the plurality of PWM drive apparatuses in common; and a control circuit for controlling the first and second switch circuits and the offset correcting circuits of the plurality of PWM drive apparatuses in common, wherein, in each of the plurality of PWM drive apparatuses, in a correction mode, the control circuit causes the first and second switch circuits to short-circuit the positive and negative input terminals of the first and second voltage-to-current converters, and the plurality of offset correcting circuits gradually change control amounts with respect to the variable current sources, from initial values thereof, in accordance with an instruction from the control circuit, to determine correction currents to be supplied to the connection points, and in a normal mode, the control circuit causes the first and second switch circuits to open between the positive and negative input terminals of the first and second voltage-to-current converters, and the plurality of offset correcting circuits supply the determined correction currents to the connection points.

14. A method for correcting an output offset of the PWM drive apparatus of claim 1, comprising:

a first step of short-circuiting positive and negative input terminals of each of the first and second voltage-to-current converters to determine a correction current to be supplied to the connection point; and a second step of canceling the short-circuit of the positive and negative input terminals of each of the first and second voltage-to-current converters and supplying the determined correction current to the connection point.

15. The method of claim 14, wherein in the first step, the current supplied to the connection point is gradually changed from an initial value thereof, and when it is detected that an output of the amplifier goes from a first logic level to a second logic level, a current at that time is stored as the correction current, and in the second step, the stored correction current is supplied to the connection point.

* * * * *